US012571325B2

(12) United States Patent
K et al.

(10) Patent No.: US 12,571,325 B2
(45) Date of Patent: Mar. 10, 2026

(54) THERMOELECTRIC GENERATOR FOR A TURBINE ENGINE

(71) Applicant: General Electric Company, Schenectady, NY (US)

(72) Inventors: Vishnu Das K, Bengaluru (IN); Vinaykumar Shrimantrao Patil, Bengaluru (IN); Manish Singhal, Bengaluru (IN); Ravindra Shankar Ganiger, Bengaluru (IN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 18/148,530

(22) Filed: Dec. 30, 2022

(65) Prior Publication Data

US 2024/0141800 A1     May 2, 2024

(30) Foreign Application Priority Data

Nov. 1, 2022     (IN) .............................. 202211062291

(51) Int. Cl.
*F01D 15/10*          (2006.01)
*F01D 11/24*          (2006.01)
          (Continued)

(52) U.S. Cl.
CPC .............. *F01D 15/10* (2013.01); *F01D 11/24* (2013.01); *H10N 10/01* (2023.02); *H10N 10/17* (2023.02);
          (Continued)

(58) Field of Classification Search
CPC ......... F01D 15/10; F01D 11/24; H10N 10/17; H10N 10/01
See application file for complete search history.

(56) References Cited

U.S. PATENT DOCUMENTS 8,578,696 B2    11/2013    Sundaram et al.
8,726,663 B2    5/2014    Schroder et al.
          (Continued)

OTHER PUBLICATIONS

Yang et al., "Annular thermoelectric generator performance optimization analysis based on concentric annular heat exchanger", Energy 239 (2022) 122127. (Year: 2022).*
          (Continued)

*Primary Examiner* — Tae-Sik Kang
(74) *Attorney, Agent, or Firm* — McCarter & English, LLP

(57)          ABSTRACT

A thermoelectric generator for a turbine engine is provided. The turbine engine can include a core having a casing surrounded by an engine cowl. The thermoelectric generator is attached to or formed integrally with the casing. The thermoelectric generator includes a power generation module formed by a plurality of thermocouples that utilize a temperature differential between a hot side and a cold side of the casing to generate electrical power. In one aspect, an electrically insulative layer is positioned between the casing and the power generation module. In another aspect, the thermoelectric generator includes a phase change material pack that includes an inner layer and an outer layer, the power generation module being positioned between the inner layer and the outer layer. In other aspects, the thermoelectric generator can be additively manufactured on the casing or another structural component of the turbine engine.

16 Claims, 9 Drawing Sheets

(51) Int. Cl.

| | |
|---|---|
| *H10N 10/01* | (2023.01) |
| *H10N 10/17* | (2023.01) |
| *B33Y 10/00* | (2015.01) |
| *B33Y 80/00* | (2015.01) |

(52) U.S. Cl.

CPC .............. *B33Y 10/00* (2014.12); *B33Y 80/00* (2014.12); *F05D 2220/76* (2013.01)

(56) References Cited

U.S. PATENT DOCUMENTS

| | | | |
|---|---|---|---|
| 9,018,512 | B2 | 4/2015 | Kwok et al. |
| 9,388,740 | B2 | 7/2016 | Kwok et al. |
| 9,806,247 | B2 | 10/2017 | Hammer et al. |
| 10,711,693 | B2 | 7/2020 | Miller et al. |
| 10,801,408 | B2 | 10/2020 | Dierksmeier et al. |
| 11,665,963 | B1 * | 5/2023 | Pal .......................... F01D 25/12 |
| | | | 60/770 |
| 2005/0022855 | A1 | 2/2005 | Raver |
| 2012/0073619 | A1 * | 3/2012 | Moors .................... H10N 10/13 |
| | | | 136/201 |
| 2012/0118345 | A1 | 5/2012 | Stoia et al. |
| 2012/0152297 | A1 | 6/2012 | Mitchell et al. |
| 2017/0335728 | A1 * | 11/2017 | Shin .......................... F01N 3/05 |
| 2019/0017438 | A1 * | 1/2019 | Miller ....................... F02C 7/32 |
| 2022/0033273 | A1 * | 2/2022 | Doi ..................... H10N 10/852 |
| 2022/0235713 | A1 * | 7/2022 | Rambo .................... F02C 6/14 |

OTHER PUBLICATIONS

Trento, What Are the Ceramic Materials With High Thermal Conductivity?, Stanford Advanced Materials, 6 Pages. Retrieved Mar. 2, 2022 from web link: https://www.samaterials.com/content/what-are-the-ceramic-materials-with-high-thermal-conductivity.html.

Faraji et al., Base-Load Thermoelectric Power Generation Using Evacuated Tube Solar Collector and Water Storage Tank, Energy Procedia, vol. 57, 2014, pp. 2112-2120. https://www.researchgate.net/figure/Schematic-of-a-commercial-thermoelectric-generator-module_fig1_274254828.

* cited by examiner

400

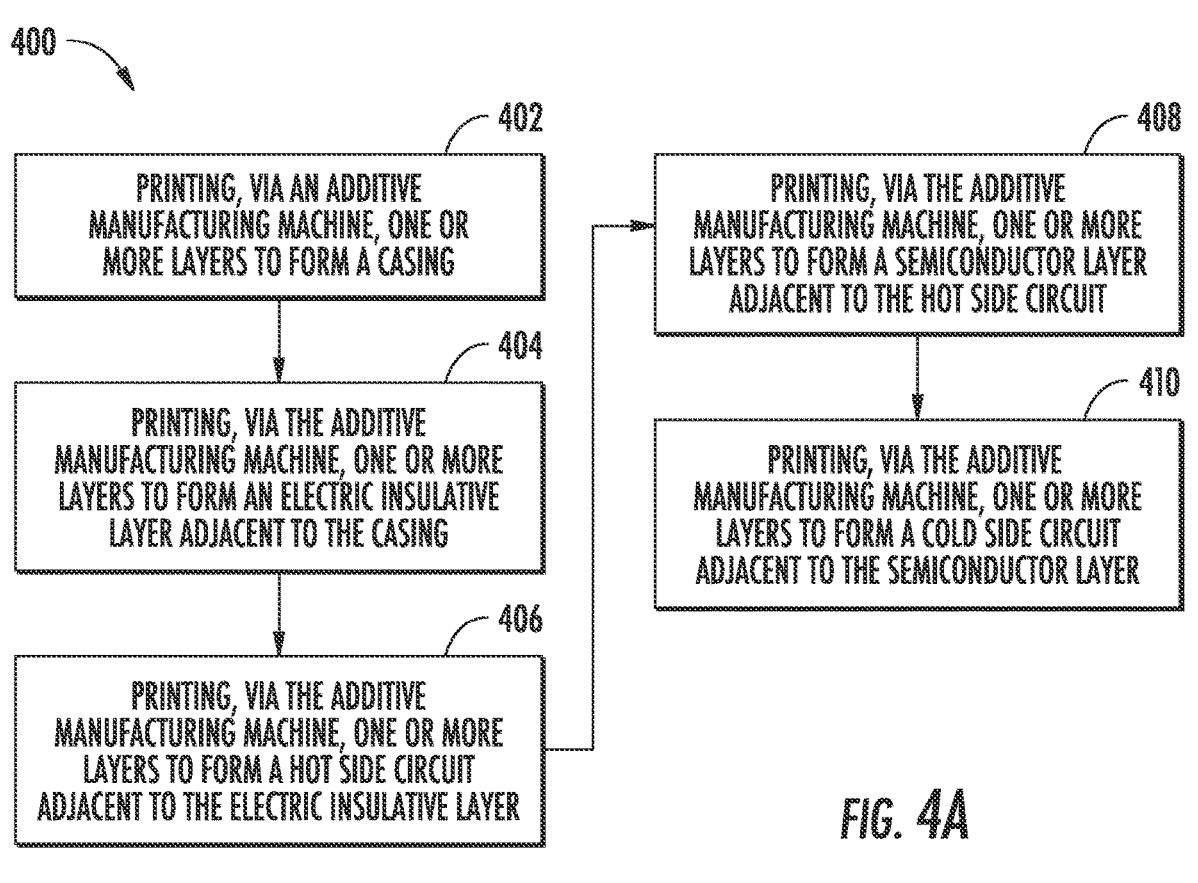

402

PRINTING, VIA AN ADDITIVE MANUFACTURING MACHINE, ONE OR MORE LAYERS TO FORM A CASING

404

PRINTING, VIA THE ADDITIVE MANUFACTURING MACHINE, ONE OR MORE LAYERS TO FORM AN ELECTRIC INSULATIVE LAYER ADJACENT TO THE CASING

406

PRINTING, VIA THE ADDITIVE MANUFACTURING MACHINE, ONE OR MORE LAYERS TO FORM A HOT SIDE CIRCUIT ADJACENT TO THE ELECTRIC INSULATIVE LAYER

408

PRINTING, VIA THE ADDITIVE MANUFACTURING MACHINE, ONE OR MORE LAYERS TO FORM A SEMICONDUCTOR LAYER ADJACENT TO THE HOT SIDE CIRCUIT

410

PRINTING, VIA THE ADDITIVE MANUFACTURING MACHINE, ONE OR MORE LAYERS TO FORM A COLD SIDE CIRCUIT ADJACENT TO THE SEMICONDUCTOR LAYER

FIG. 4A

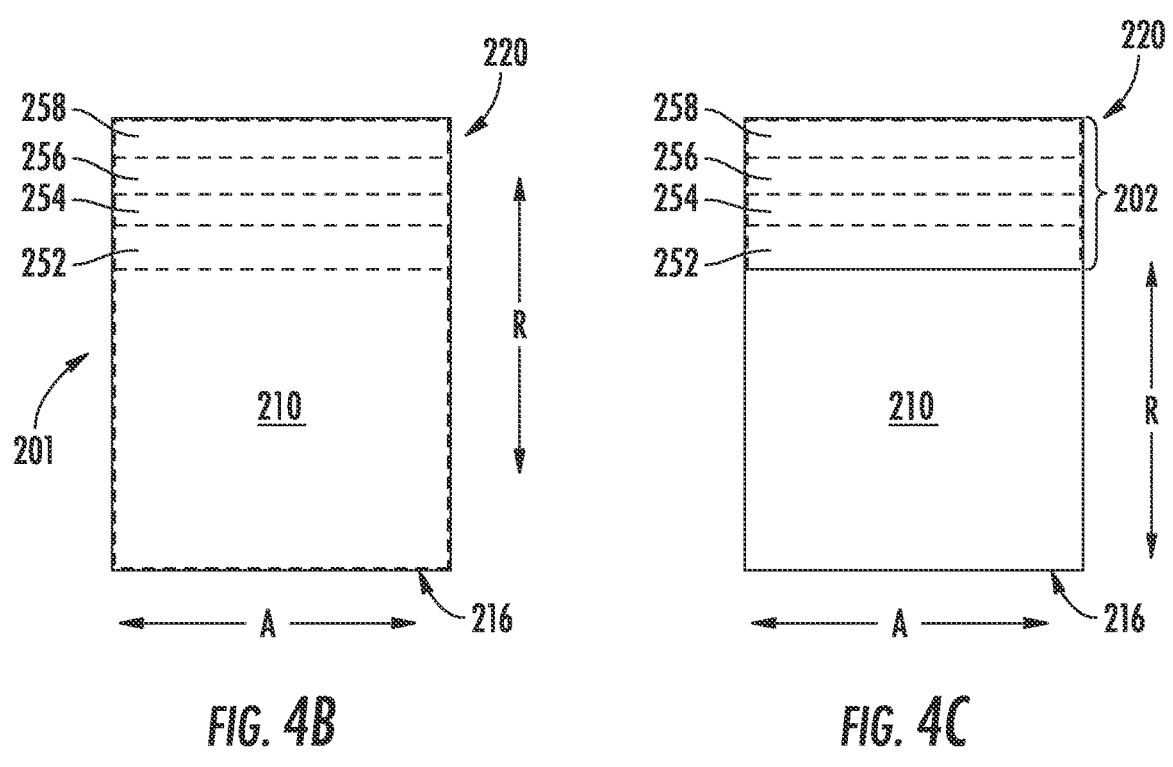

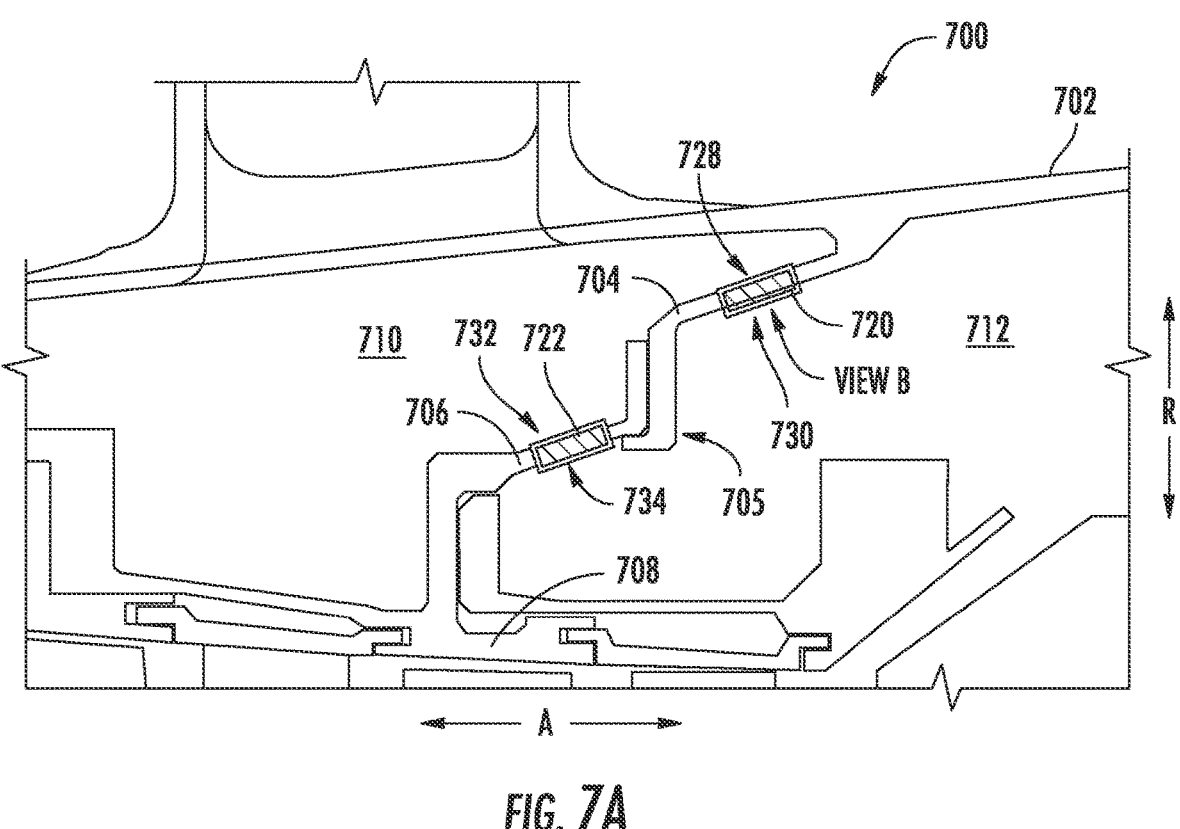
FIG. 7A
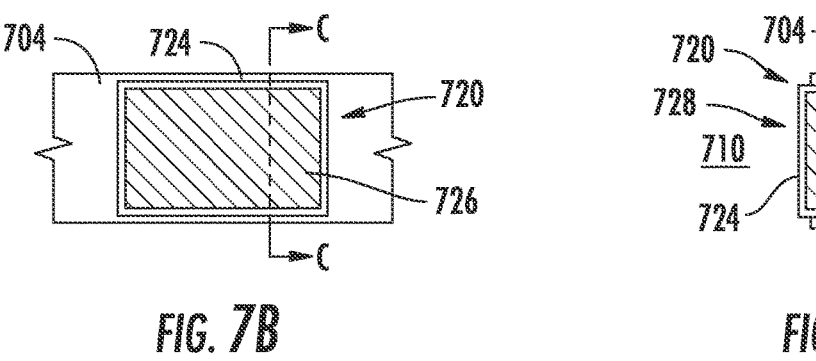
FIG. 7B
FIG. 7C

THERMOELECTRIC GENERATOR FOR A TURBINE ENGINE

PRIORITY INFORMATION

The present application claims priority to Indian Patent Application Number 202211062291 filed on Nov. 1, 2022.

FIELD

The present disclosure relates to thermoelectric generators for turbine engines.

BACKGROUND

Gas turbine engines can include various devices that consume electrical power, such as probes, sensors, etc. One or more power sources can supply electrical power to the power consuming devices. An improved electrical power source or power source system that can supply electrical power to power consuming devices would be a welcome addition to the art.

BRIEF DESCRIPTION OF THE DRAWINGS

A full and enabling description of the present disclosure, including the best mode thereof, directed to one of ordinary skill in the art, is set forth in the specification, which makes reference to the appended figures, in which:

FIG. 4A provides a flow diagram for a method of integrally forming a thermoelectric generator with a casing or structural component of a turbine engine via an additive manufacturing process;

FIG. 4B provides a close-up, cross-sectional view of a monolithic component having a thermoelectric generator integrally formed with a casing or structural component of a turbine engine;

FIG. 4C provides a close-up, cross-sectional view of a casing integrally formed with a thermoelectric generator that has been 3D printed on the casing;

FIG. 7A provides a close-up, cross-sectional view of a part of a high pressure compressor of a turbine engine and depicts thermoelectric generators disposed on a casing wall separating a relatively cool cavity from a relatively hot cavity according to one example embodiment of the present disclosure;

FIG. 7B provides a view of one of the thermoelectric generators of FIG. 7A taken from View B of FIG. 7A;

FIG. 7C provides a close-up, cross-sectional view of the thermoelectric generator of FIG. 7B taken from line C-C of FIG. 7B.

DETAILED DESCRIPTION

Figure 1:
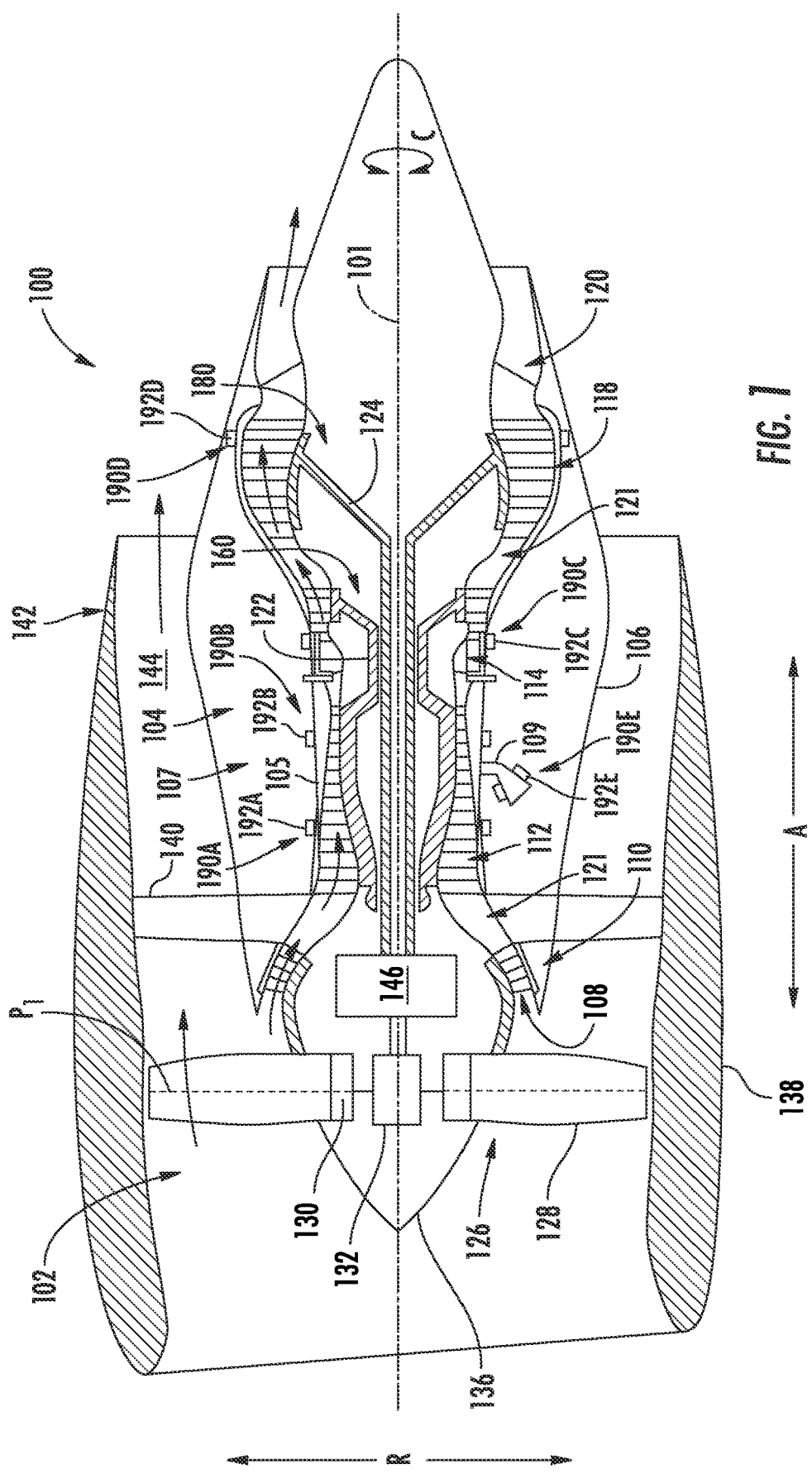
FIG. 1 is a schematic, cross-sectional view of a gas turbine engine having one or more thermoelectric generator systems according to example embodiments of the present disclosure.

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The singular forms "a", "an", and "the" include plural references unless the context clearly dictates otherwise.

The terms "upstream" and "downstream" refer to the relative direction with respect to fluid flow in a fluid pathway. For example, "upstream" refers to the direction from which the fluid flows, and "downstream" refers to the direction to which the fluid flows.

As used herein, a "relatively hot" side, cavity, fluid, etc. is meant to denote that a particular thing is hot relative to a counterpart side, cavity, fluid, etc. A "relatively cool" side, cavity, fluid, etc. is meant to denote that a particular thing is cold relative to a counterpart side, cavity, fluid, etc. In this regard, the term "relatively" as it relates to temperature is used to signify that one thing is hotter or colder than another thing, in a comparative manner.

Gas turbine engines can include various power consuming devices and/or electrical energy storage devices. Accordingly, one or more power sources can be configured to supply electrical power to the power consuming devices and/or electrical energy storage devices. In gas turbine engines for aircraft, power sources that are compact, relatively light in weight, local to the power consuming devices and/or electrical energy storage devices, and efficient at meeting power requirements have been challenging to develop. Accordingly, in accordance with the inventive aspects of the present disclosure, various embodiments of thermoelectric generators for turbine engines are provided herein that address one or more of the noted challenges. The thermoelectric generators provided herein can be disposed on metallic structural components of turbine engines to harness the heat therefrom to ultimately generate electrical power that can be provided to one or more power consumers and/or electrical energy storage devices.

In one aspect, a thermoelectric generator disposed on a metallic structural component is provided. The metallic structural component can be a casing of the core of the turbine engine, for example. The thermoelectric generator includes an electrically insulative layer and a power generation module formed of a plurality of thermocouples. The electrically insulative layer is positioned between the casing and the power generation module to electrically isolate the casing from the power generation module. The electrically insulative layer can be a thin film ceramic coating or substrate, for example.

In another aspect, a thermoelectric generator disposed on a metallic structural component is provided. The metallic structural component can be a casing of the core of the turbine engine, for example. The thermoelectric generator includes a phase change material pack and a power generation module formed of a plurality of thermocouples. The phase change material pack includes a hot side layer and a cold side layer. The power generation module is positioned between the hot side layer and the cold side layer of the phase change material pack. The placement and positioning of the layers of the phase change material pack enables the thermoelectric generator to maintain the temperature differential between a hot side and a cold side of the thermoelectric generator, which may enhance its power generation capabilities and efficiency.

In yet another aspect, a thermoelectric generator that is 3D (three dimensional) printed with or on a metallic structural component is provided. The thermoelectric generator can be 3D printed with the metallic structural component to form a monolithic component in a single multi-material print or the thermoelectric generator can be 3D printed on an existing metallic structural component. In this regard, the thermoelectric generator can be integrally constructed with the metallic structural component. The thermoelectric generator can be integrally constructed with the metallic structural component through hybrid/additive/cold spray/thermal spray manufacturing techniques. 3D printing the thermoelectric generator integral with the metallic structural component can enable optimal usage of available space and creates a compact and light electrical power source that can be positioned local to one or more power consumers.

In a further aspect, one or more thermoelectric generators of a thermoelectric generator system are strategically positioned within a turbine engine or configured for enhanced power generation capability and efficiency, even during prolonged periods of operation of the turbine engine. As one example, a thermoelectric generator can be positioned along a cooling fluid pathway within an active clearance control cavity. This may facilitate keeping the cold side of the thermoelectric generator cool. As another example, a thermoelectric generator can be positioned along a casing so that a hot side of the thermoelectric generator is directly exposed to a relatively hot cavity (having relatively hot fluid therein) and so that a cold side of the thermoelectric generator is directly exposed to a relatively cool cavity (having relatively cool fluid therein). This may facilitate keeping the cold side of the thermoelectric generator cool and keeping the hot side of the thermoelectric generator hot. As a further example, a thermoelectric generator can be positioned within a port defined by a casing that separates a relatively cool cavity from a relatively hot cavity. The thermoelectric generator can be received within the port so that at least a portion of the thermoelectric generator is positioned within the relatively hot cavity. The thermoelectric generator can include an electrically insulative layer having one or more perforations that allow hot fluid from the relatively hot cavity to directly contact the power generation components of the thermoelectric generator. This may facilitate keeping the hot side of the thermoelectric generator hot. Keeping the hot side hot and/or the cold side cold of a thermoelectric generator can increase the temperature differential therebetween, which ultimately can increase the power generation capability and efficiency of the thermoelectric generator.

Referring now to the drawings, wherein identical numerals indicate the same elements throughout the figures, FIG. 1 provides a schematic, cross-sectional view of a gas turbine engine 100. For this embodiment, the gas turbine engine 100 is a high-bypass turbofan engine configured to be mounted to an aircraft. As shown in FIG. 1, the gas turbine engine 100 defines an axial direction A (extending parallel to a longitudinal centerline 101 provided for reference), a radial direction R, and a circumferential direction C (extending about the axial direction A).

The gas turbine engine 100 includes a fan section 102 and a core 104 disposed downstream of the fan section 102. The core 104 includes a core casing 105 and an engine cowl 106 surrounding the core casing 105. The core casing 105 can be formed of a single case or a plurality of interconnected casing sections, for example. The engine cowl 106 defines an under cowl cavity 107. Further, the engine cowl 106 defines an annular core inlet 108. The engine cowl 106 encases, in a serial flow relationship, a compressor section including a booster or low pressure compressor (LP compressor 110) and a high pressure compressor (HP compressor 112); a combustion section 114; a turbine section including a high pressure turbine (HP turbine 116) and a low pressure turbine (LP turbine 118); and a jet exhaust nozzle section 120. The compressor section, combustion section 114, turbine section, and jet exhaust nozzle section 120 together define a core air flowpath 121 extending from the annular core inlet 108 through the LP compressor 110, HP compressor 112, combustion section 114, HP turbine 116, LP turbine 118, and jet exhaust nozzle section 120.

A high pressure shaft (HP shaft 122) drivingly connects the HP turbine 116 to the HP compressor 112. The HP shaft 122 and rotating components of the HP compressor 112 and the HP turbine 116 that are mechanically coupled with the HP shaft 122 collectively form a high pressure spool 160. A low pressure shaft (LP shaft 124) drivingly connects the LP turbine 118 to the LP compressor 110. The LP shaft 124 and rotating components of the LP compressor 110 and the LP turbine 118 that are mechanically coupled with the LP shaft 124 collectively form a low pressure spool 180.

The fan section 102 includes a variable pitch fan 126 having a plurality of fan blades 128 coupled to a disk 130 in a spaced apart manner. As depicted, the fan blades 128 extend outward from the disk 130 generally along the radial direction R. For the variable pitch fan 126 of FIG. 1, each fan blade 128 is rotatable relative to the disk 130 about a pitch axis $P_1$ by virtue of the fan blades 128 being mechanically coupled to an actuation member 132 configured to collectively vary the pitch of the fan blades 128 in unison. The fan blades 128, disk 130, and actuation member 132 are together rotatable about the longitudinal centerline 101 by the LP spool 180. For this embodiment, the LP spool 180 is mechanically coupled with the fan 126 via a gearbox 146. In some alternative embodiments, the LP shaft 124 of the LP spool 180 can be directly mechanically coupled with the fan 126 in a direct-drive configuration. Further, in some alternative embodiments, the fan blades 128 may be fixed and not rotatable about respective pitch axes.

Referring still to FIG. 1, the disk 130 is covered by a spinner or rotatable front hub 136 aerodynamically contoured to promote an airflow through the plurality of fan blades 128. Additionally, the fan section 102 includes an outer nacelle 138 that circumferentially surrounds the fan 126 and/or at least a portion of the core 104. The nacelle 138 is supported relative to the core 104 by a plurality of circumferentially-spaced outlet guide vanes 140. A downstream section 142 of the nacelle 138 extends over an outer portion of the core 104 so as to define a bypass passage 144 therebetween.

The gas turbine engine 100 can include one or more thermoelectric generator systems each having one or more thermoelectric generators disposed on a casing or other structural component of the core 104. For instance, as shown in FIG. 1, the gas turbine engine 100 can include one or more of: a first thermoelectric generator system 190A having one or more thermoelectric generators 192A disposed on the core casing 105, a second thermoelectric generator system 190B having one or more thermoelectric generators 192B disposed on the core casing 105, a third thermoelectric generator system 190C having one or more thermoelectric generators 192C disposed on the core casing 105, a fourth thermoelectric generator system 190D having one or more thermoelectric generators 192D disposed on the core casing 105, and/or a fifth thermoelectric generator system 190E having one or more thermoelectric generators 192E disposed on a bleed duct casing 109.

The one or more thermoelectric generators 192A of the first thermoelectric generator system 190A are disposed on the core casing 105 along the compressor section and forward of the bleed duct casing 109 along the axial direction A. The one or more thermoelectric generators 192B of the second thermoelectric generator system 190B are disposed on the core casing 105 along the compressor section and aft of the bleed duct casing 109 along the axial direction A. The one or more thermoelectric generators 192C of the third thermoelectric generator system 190C are disposed on the core casing 105 along the combustion section 114 (e.g., along a combustor casing). The one or more thermoelectric generators 192D of the fourth thermoelectric generator system 190D are disposed on the core casing 105 along the turbine section, or more specifically, along the LP turbine 118. The one or more thermoelectric generators 192E of the fifth thermoelectric generator system 190E are disposed on the bleed duct casing 109.

The thermoelectric generator systems 190A through 190E can include a single thermoelectric generator extending annularly around the core casing 105 and/or the bleed duct casing 109 or at least two thermoelectric generators spaced from one another along the circumferential direction C. The thermoelectric generator systems 190A through 190E are configured to generate electrical power by taking advantage of a temperature differential between a relatively hot surface and/or cavity and a relatively cool surface and/or cavity. The thermoelectric generator systems 190A through 190E can be used to power one or more local devices, probes, sensors, can be used for active mitigation (pumps/fans) to address the risk of coking and a Bowed Rotor Start (BRS) even during shutdown conditions, and can be used to charge electronical energy storage devices, for example. Novel and inventive thermoelectric generators that may be implemented in a thermoelectric generator system for a turbine engine, such as any of the thermoelectric generator systems 190A through 190E, will be described in detail below.

Moreover, although the gas turbine engine 100 is depicted in FIG. 1 and described above as a turbofan engine, the inventive aspects of the present disclosure are also applicable to turbomachines and turbine engines generally, including propfan, turbojet, turboprop, and turboshaft gas turbine engines, including marine and industrial turbine engines and auxiliary power units. Further, although described above as a two-spool gas turbine engine, the present disclosure is also applicable to three-spool gas turbine engines.

Figure 2:
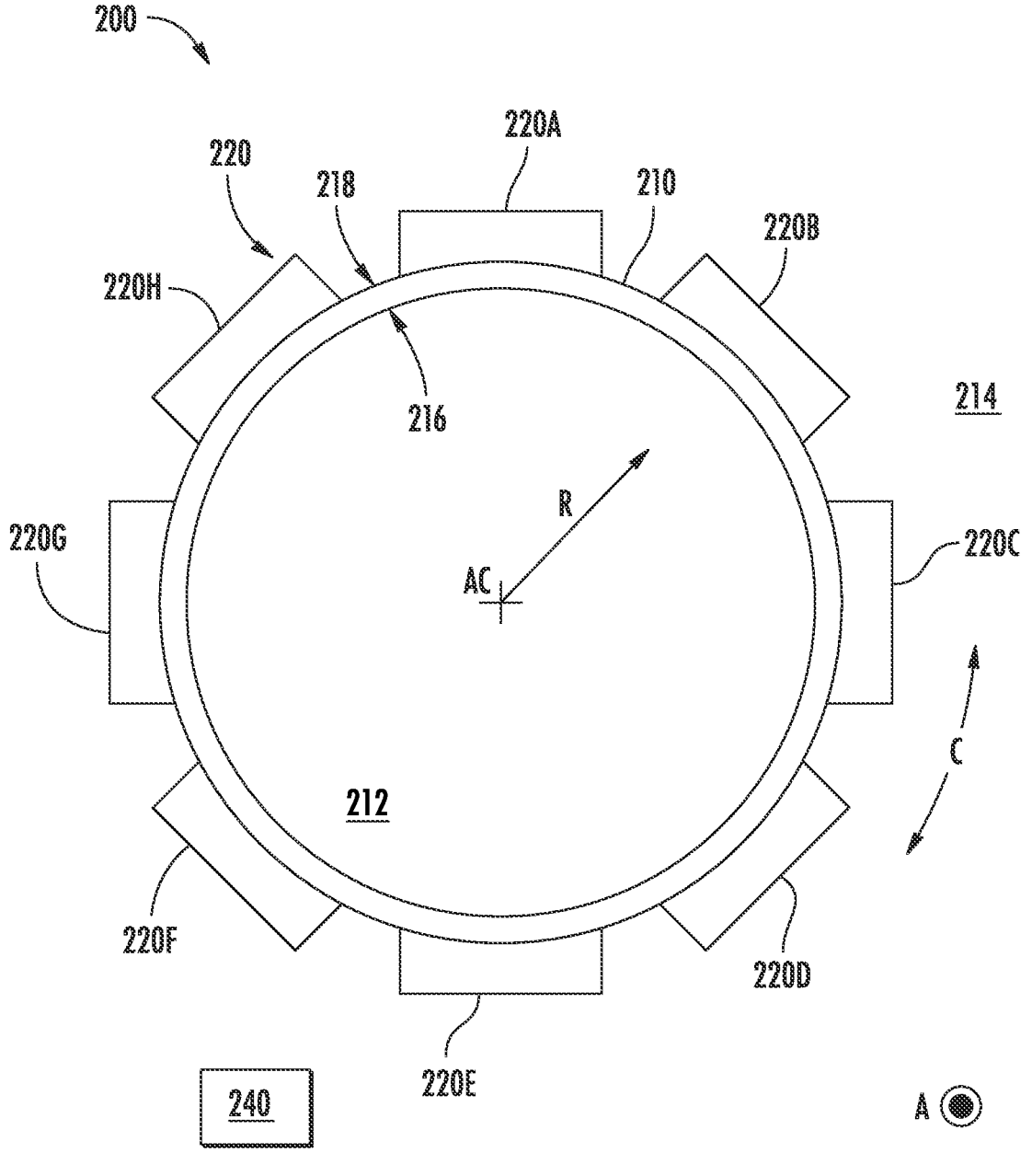
FIG. 2 provides a schematic, forward-looking-aft cross-sectional view of a thermoelectric generator system arranged on a casing of a turbine engine according to example embodiments of the present disclosure.

FIG. 2 provides a schematic, forward-looking-aft cross-sectional view of a thermoelectric generator system 200 arranged on a casing 210 of a turbine engine according to example embodiments of the present disclosure. The thermoelectric generator system 200 can be implemented as any one of the thermoelectric generator systems 190A through 190E of FIG. 1, for example.

As shown in FIG. 2, structural element or casing 210 defines a hot side 212 and a cold side 214. The casing 210 also defines an axial direction A (extending into and out of the page in FIG. 2), a radial direction R, and a circumferential direction C. Further, the casing 210 defines an axial centerline AC. For this example embodiment, an inner surface 216 of the casing 210 is exposed to the hot side 212 and an outer surface 218 of the casing 210 is exposed to the cold side 214. The hot side 212 can be heated, e.g., by hot gas moving along a core air flowpath, and the cold side 214 can be, e.g., an under cowl cavity. In other embodiments, the inner surface 216 of the casing 210 can be exposed to the cold side 214 and the outer surface 218 of the casing 210 can be exposed to the hot side 212.

The thermoelectric generator system 200 includes one or more thermoelectric generators each attached to or formed integrally with the casing 210. For this embodiment, the thermoelectric generator system 200 includes a plurality of thermoelectric generators 220, including a first thermoelectric generator 220A, a second thermoelectric generator 220B, a third thermoelectric generator 220C, a fourth thermoelectric generator 220D, a fifth thermoelectric generator 220E, a sixth thermoelectric generator 220F, a seventh thermoelectric generator 220G, and an eighth thermoelectric generator 220H. The thermoelectric generators 220 are circumferentially-spaced from one another along the circumference of the casing 210 and form a thermoelectric generator array. Although eight (8) thermoelectric generators 220 are depicted in FIG. 2, it will be appreciated that the thermoelectric generator system 200 can have N number of thermoelectric generators, wherein N is an integer equal to or greater than one (1).

At least two of the thermoelectric generators 220 can be electrically coupled with one another in series, in parallel, or a combination of series and parallel. In some embodiments, all the thermoelectric generators 220 of the array can be electrically coupled with one another in series, in parallel, or a combination of series and parallel. The electric power generated by the thermoelectric generators 220 can be provided to one or more electrical loads 240, such as one or more power consuming devices and/or energy storage devices. For instance, the thermoelectric generators 220 can provide electric power to one or more power pumps, sensors, drives, blowers, anti-ice systems, local heating or cooling systems, valves, etc. As one specific example, the thermoelectric generators 220 can provide electric power to an electrical anti-ice system for a low pressure compressor or booster. As another example, the thermoelectric generators 220 can provide electric power to one or more sensors and/or cameras and/or Internet of Things (IoT) devices, e.g., for real time condition monitoring of a turbine engine, predicting events for timely actions/controls and/or for predictive maintenance. As yet another example, the thermoelectric generators 220 can provide electric power to a Reverse Bleed System (RBS) blower fan. As a further example, the thermoelectric generators 220 can provide electric power to a pump to blow cold air to a nozzle tip to prevent coking. As another example, the thermoelectric generators 220 can provide electric power to an auxiliary system of lubrication for power gearbox post fan blade out events. As yet a further example, the thermoelectric generators 220 can provide electric power to solenoid-activated valves & pumps.

In addition, advantageously, the thermoelectric generators 220 can generate electric power even after shut down of a turbine engine, e.g., for 10-15 minutes. In this regard, the thermoelectric generators 220 can be used to provide electric power to systems that run post engine shut down. For example, the thermoelectric generators 220 can be used to drive a pump to suction out and/or pump in the air at shut down to mitigate a BRS issue.

The thermoelectric generators 220 can be mechanically coupled with the casing 210 in various ways. As one example, the thermoelectric generators 220 can be mechanically coupled with the casing 210 via bolted joints, wherein each thermoelectric generator 220 includes flanges, shells, or pads through which bolts are inserted to connect them to the casing 210. Rivetted joints may also be used. As another example, the thermoelectric generators 220 can be mechanically coupled with the casing 210 via permanent joints, wherein the thermoelectric generators 220 are brazed and/or welded on to the casing 210. As a further example, the thermoelectric generators 220 can be mechanically coupled with the casing 210 via a temporary or retrofittable joint, wherein racks and/or rails are mounted to the casing 210 (brazed/welded/additively deposited) and flanges of the thermoelectric generators 220 can be slidingly received within the racks and/or rails. As yet another example, the thermoelectric generators 220 can be mechanically coupled with the casing 210 via an interference fit joint, wherein the thermoelectric generators 220 can each be fit into the casing 210 either through an axial interference fit with the casing 210 (or with a circumferential interference fit in embodiments wherein the thermoelectric generators include a single annular thermoelectric generator). As a further example, the thermoelectric generators 220 can be mechanically coupled with the casing 210 in an integral construction. That is, the thermoelectric generators 220 can be constructed integrally with the casing 210 through additive/hybrid manufacturing.

Figures 3A, 3B:
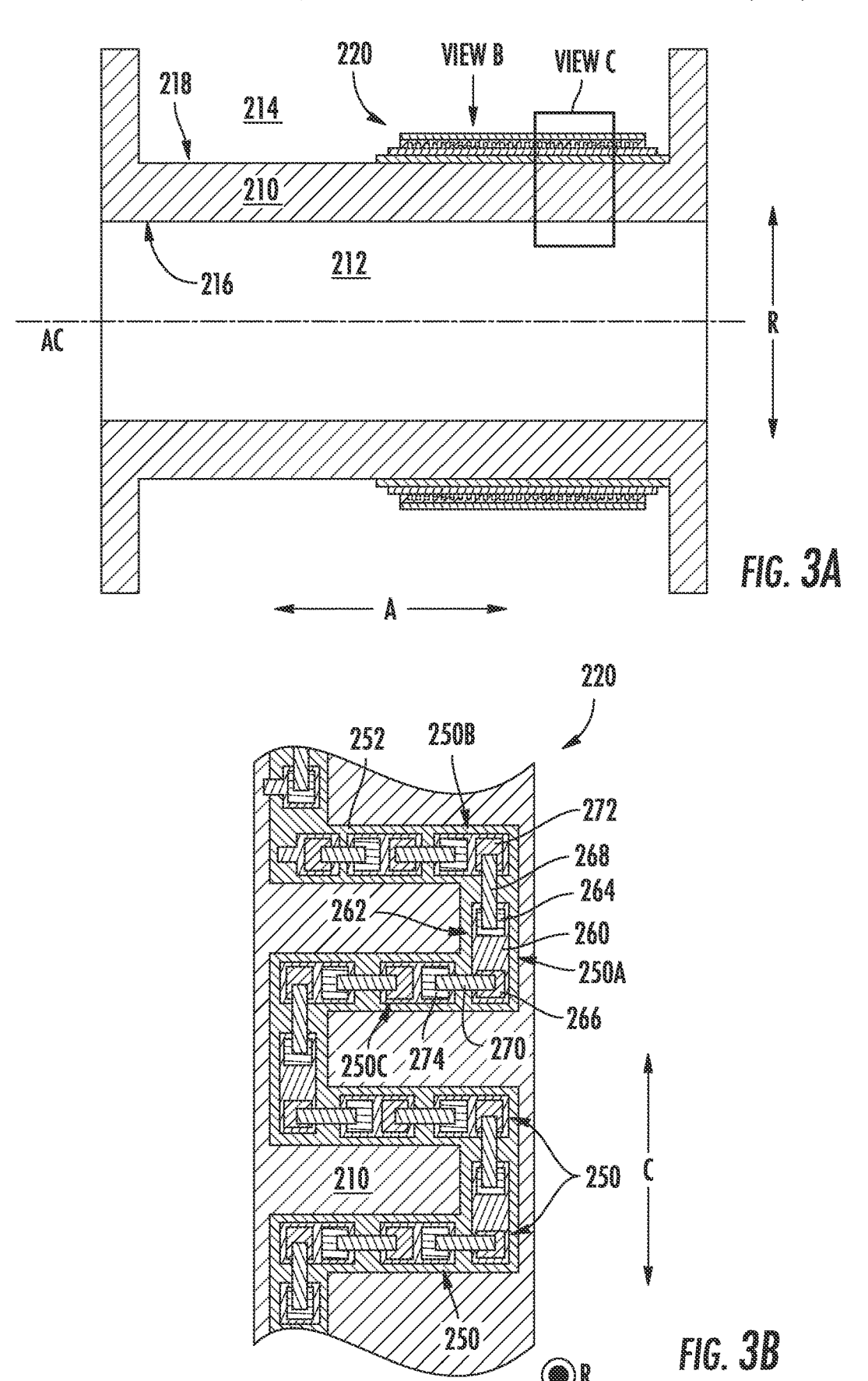
FIG. 3A provides a schematic, cross-sectional view of one example thermoelectric generator that may be implemented in a thermoelectric generator system according to one example embodiment of the present disclosure.
FIG. 3B provides a view of the thermoelectric generator of FIG. 3A taken from View B of FIG. 3A.
Figure 3C:
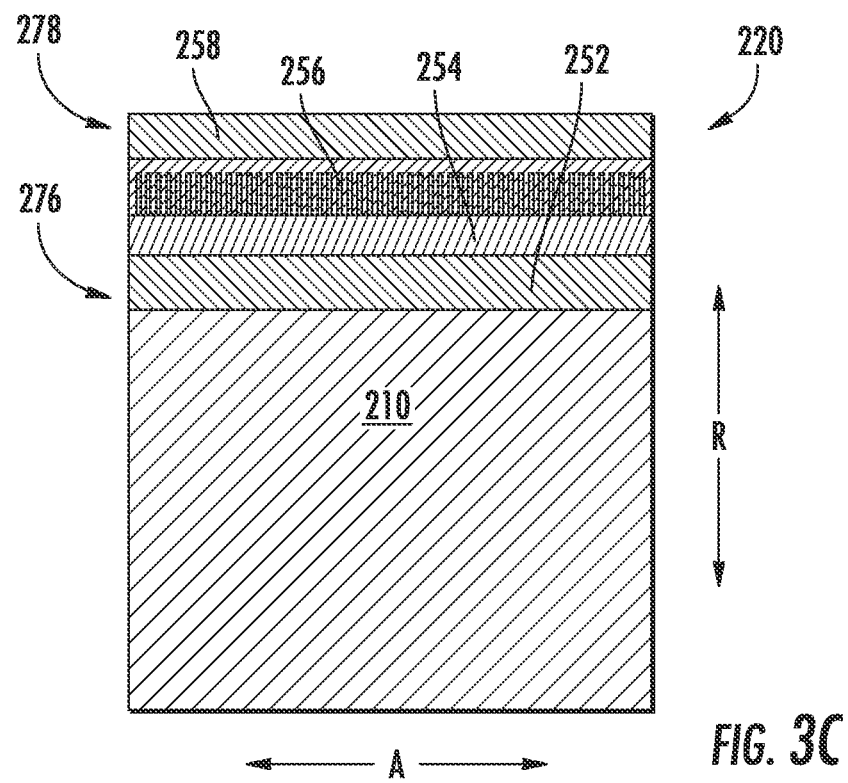
FIG. 3C provides a close-up view of the thermoelectric generator of FIG. 3A taken from View C of FIG. 3A.
Figure 3D:
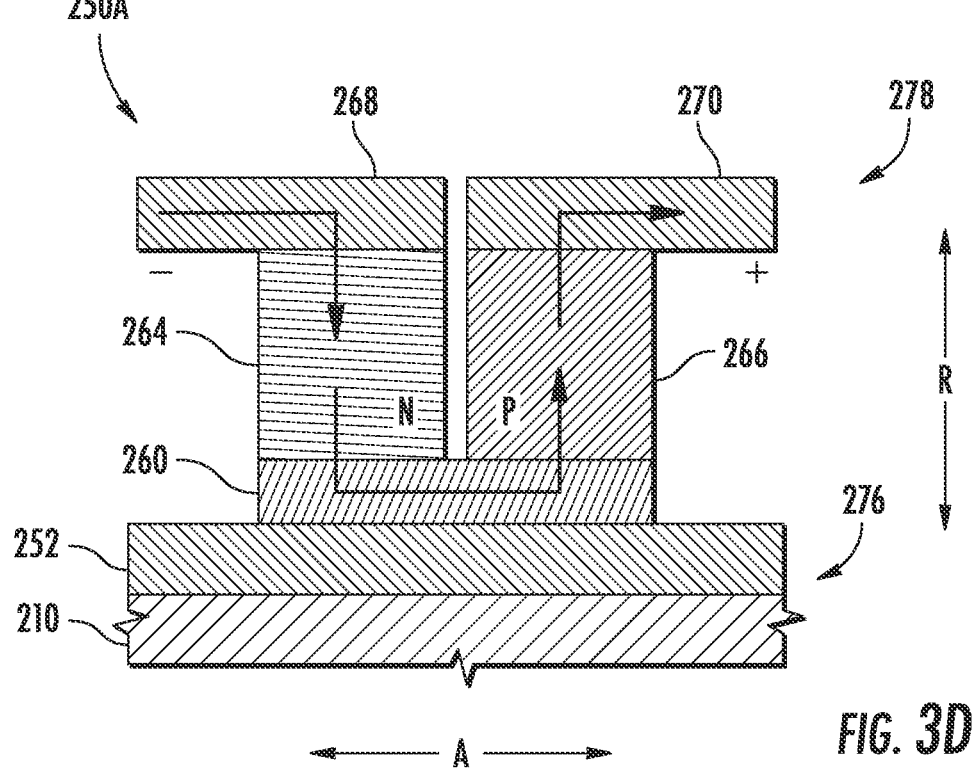
FIG. 3D provides a close-up view of one thermocouple of the thermoelectric generator of FIG. 3A.

With reference now to FIGS. 3A, 3B, 3C, and 3D, FIG. 3A provides a schematic, cross-sectional view of one example thermoelectric generator 220 that may be implemented in a thermoelectric generator system, such as the thermoelectric generator system 200 of FIG. 2. FIG. 3B provides a view of the thermoelectric generator 220 taken from View B of FIG. 3A. FIG. 3C provides a close-up view of the thermoelectric generator 220 taken from View C of FIG. 3A. FIG. 3D provides a close-up view of one thermocouple of the thermoelectric generator 220.

For the embodiment shown in FIG. 3A, the thermoelectric generator 220 is attached to the casing 210. The thermoelectric generator 220 includes an electric insulative layer 252 and a power generation module formed by a plurality of thermocouples 250 electrically coupled with one another. The casing 210 to which the thermoelectric generator 220 is attached can be formed of a metallic material, for example. The electric insulative layer 252 can advantageously electrically insulate or electrically decouple the casing 210 from the electric power generation components of the thermoelectric generator 220 (i.e., the electrically coupled thermocouples 250). The electric insulative layer 252 can be a thin film ceramic coating in certain example embodiments. Example materials for the ceramic coating include, without limitation, silicon carbide, silicon nitride, beryllium oxide, aluminum nitride or a similar material with high thermal conductivity and low electrical conductivity. In some embodiments, the thin film ceramic coating can be, without limitation, equal to or greater than 0.0001 inches (0.00254 mm) and equal to or less than 0.030 inches (0.762 mm). Generally, the thinner the thickness of the thin film ceramic coating, the better the heat absorption effectiveness of the power generation module.

As shown in FIG. 3B, the electric insulative layer 252 is attached to the casing 210 and arranged in a serpentine configuration. In other embodiments, the electric insulative layer 252 may have other configurations. For instance, in some embodiments, the electric insulative layer 252 can extend annularly around the casing 210 and can have a same width around the casing 210. The plurality of electrically coupled thermocouples 250, including a first thermocouple 250A, a second thermocouple 250B, and a third thermocouple 250C, among others that are not labeled in FIG. 3B, are arranged along the electric insulative layer 252.

The first thermocouple 250A includes a hot side plate 260 (or inner plate in this example embodiment). The hot side plate 260 can be formed of an electrically conducting material, such as copper or another metallic material. The hot side plate 260 is disposed directly on the electric insulative layer 252 in this embodiment. The first thermocouple 250A also includes a semiconductor array 262 that includes an N-type semiconductor 264 and a P-type semiconductor 266 disposed on the hot side plate 260. The hot side plate 260 acts as an electric bridge to electrically couple the N-type semiconductor 264 and the P-type semiconductor 266 of the first thermocouple 250A. The first thermocouple 250A further includes first and second cold side plates 268, 270 (or outer plates in this example embodiment). The first cold side plate 268 electrically couples the N-type semiconductor 264 of the first thermocouple 250A with a P-type semiconductor 272 of the second thermocouple 250B. The second cold side plate 270 electrically couples the P-type semiconductor 266 with an N-type semiconductor 274 of the third thermocouple 250C. The first and second cold side plates 268, 270 can be formed of an electrically conducting material, such as copper or another metallic material. The semiconductor array 262 is positioned between the hot side plate 260 and the first and second cold side plates 268, 270, e.g., along the radial direction R (into and out of the page in FIG. 3B).

Due to the temperature differential between the hot side 212 and the cold side 214 of the casing 210, which consequently creates a hot side 276 and a cold side 278 of the thermoelectric generator 220 (see FIGS. 3C and 3D), electric current can flow serially through the first thermocouple 250A. Electric current can flow serially through the first thermocouple 250A by flowing through the first cold side plate 268, the N-type semiconductor 264, the hot side plate 260, the P-type semiconductor 266, and may exit the first thermocouple 250A through the second cold side plate 270. The electric current exiting the first thermocouple 250A flows to the third thermocouple 250C and onward to the other thermocouples 250 of the thermoelectric generator 220. The arrows in FIG. 3D depict an example manner in which electric current can flow through the first thermocouple 250A.

The first thermocouple 250A and the other thermocouples 250 of the thermoelectric generator 220 utilize the Seebeck effect to generate electrical power. The greater the temperature differential between the hot side 212 and the cold side 214 of the casing 210, the greater the voltage scale of the first thermocouple 250A. The smaller the temperature differential between the hot side 212 and the cold side 214, the smaller the voltage scale of the first thermocouple 250A. With greater voltages, more electric power can be produced.

The thermoelectric generator 220 can include N number of thermocouples, wherein N is an integer equal to or greater than one (1).

The other thermocouples 250 of the thermoelectric generator 220, including the second and third thermocouples 250B, 250C, can be configured and generate electrical power in a similar manner as described above with respect to the first thermocouple 250A.

As shown in FIG. 3C, the plurality of thermocouples 250 collectively form a hot side circuit 254 (or inner electric circuit in this embodiment), a semiconductor layer 256, and a cold side circuit 258 (or outer electric circuit in this example embodiment) of the thermoelectric generator 220. The hot side circuit 254 is formed by a network of hot side plates of the thermocouples 250, the semiconductor layer 256 is formed by a plurality of semiconductor arrays of the thermocouples 250 (wherein each semiconductor array includes both an N-type and P-type semiconductor), and the cold side circuit 258 is formed by a network of cold side plates of the thermocouples 250.

For instance, the hot side plate 260 of the first thermocouple 250A and the hot side plates of the other thermocouples 250 collectively form the hot side circuit 254 of the thermoelectric generator 220. The N-type semiconductor 264 and the P-type semiconductor 266 of the first thermocouple 250A, and the other P-type and N-type semiconductors of the other thermocouples 250 collectively form the semiconductor layer 256 of the thermoelectric generator 220. The first and second cold side plates 268, 270 of the first thermocouple 250A and the cold side plates of the other thermocouples 250 collectively form the cold side circuit 258 of the thermoelectric generator 220. The electric insulative layer 252 is disposed between the casing 210 and the hot side plates of each thermocouple 250 to electrically isolate the casing 210 from the thermocouples 250.

In some alternative example embodiments, instead of the thermoelectric generator 220 of FIGS. 3A, 3B, 3C being attached to the casing 210 (i.e., the casing 210 and thermoelectric generator 220 being formed separately from one another and the thermoelectric generator 220 subsequently being attached to the casing 210), the thermoelectric generator 220 and the casing 210 can be formed as a monolithic component. For instance, in some embodiments, the casing 210 and the thermoelectric generator 220 can be formed as a unitary monolithic component via an additive manufacturing process (or 3D printing process). The casing 210 and the thermoelectric generator 220 can be formed as a unitary monolithic component via the additive manufacturing process in a single print, for example.

FIG. 4A provides a flow diagram for a method 400 of integrally forming a thermoelectric generator with a casing or structural component of a turbine engine via a 3D printing or an additive manufacturing process.

At 402, the method 400 includes printing, via an additive manufacturing machine, one or more layers to form the casing. The one or more layers forming the casing 210 can be formed with a metallic material, for example. At 404, the method 400 includes printing, via the additive manufacturing machine, one or more layers to form the electric insulative layer adjacent to the casing. The one or more layers forming the electric insulative layer can be formed with a ceramic material, for example. At 406, the method 400 includes printing, via the additive manufacturing machine, one or more layers to form a hot side circuit (collectively formed by hot side plates) adjacent to the electric insulative layer. The one or more layers forming the hot side circuit can be formed with an electrically conducting material, for example. At 408, the method 400 includes printing, via the additive manufacturing machine, one or more layers to form a semiconductor layer adjacent to the hot side circuit with semiconductor materials for N-type and P-type semiconductors. At 410, the method 400 includes printing, via the additive manufacturing machine, one or more layers to form a cold side circuit (collectively formed by cold side plates) adjacent to the semiconductor layer. The one or more layers forming the cold side circuit can be formed with an electrically conducting material, for example. It will be appreciated that, depending on the position along the circumference of the part being formed, the steps of the method 400 can be completed in reverse.

FIG. 4B provides a close-up, cross-sectional view of a monolithic component 201 having a thermoelectric generator 220 integrally formed with a casing 210 or structural component of a turbine engine. The monolithic component 201 can be formed by the method 400 of FIG. 4A, for example. As shown, the monolithic component 201 includes various segments, including a casing 210 or casing segment formed of a metallic material, an electric insulative layer 252 or insulative segment formed adjacent to the casing segment, a hot side circuit 254 or hot side circuit segment formed adjacent to the insulative segment, a semiconductor layer 256 or semiconductor segment formed adjacent to the hot side circuit segment, and a cold side circuit 258 or cold side circuit segment formed adjacent to the semiconductor segment. The hot side circuit segment, the semiconductor segment, and the cold side circuit segment can collectively form a power generation module segment.

In other example embodiments, the casing 210 can be formed as a monolithic component with some but not all components of the thermoelectric generator 220. As one example, the casing 210 and the electric insulative layer 252 can be formed as a single monolithic component and the electrically coupled thermocouples 250 can be formed separately therefrom (e.g., via an additive or other manufacturing process) and attached to the outer printed layer of the electric insulative layer 252 of the monolithic component. In this regard, the single monolithic component made up of the casing 210 and the electric insulative layer 252 can be formed according to steps 402 and 404 of the method 400 of FIG. 4A, and the electrically coupled thermocouples 250 can be attached to the electric insulative layer 252.

In yet other example embodiments, the casing 210 can be formed as one component and the thermoelectric generator 220 can be 3D printed thereon. FIG. 4C provides a close-up, cross-sectional view of a casing 210 integrally formed with a thermoelectric generator 220 that has been 3D printed thereon. As shown in FIG. 4C, the thermoelectric generator 220 is 3D printed as a monolithic component 202 on the casing 210. The monolithic component 202, or monolithic thermoelectric generator, is formed of the various noted segments. The monolithic component 202, or monolithic thermoelectric generator, can be formed according to the method 400 of FIG. 4A, less step 402.

Figure 5A:
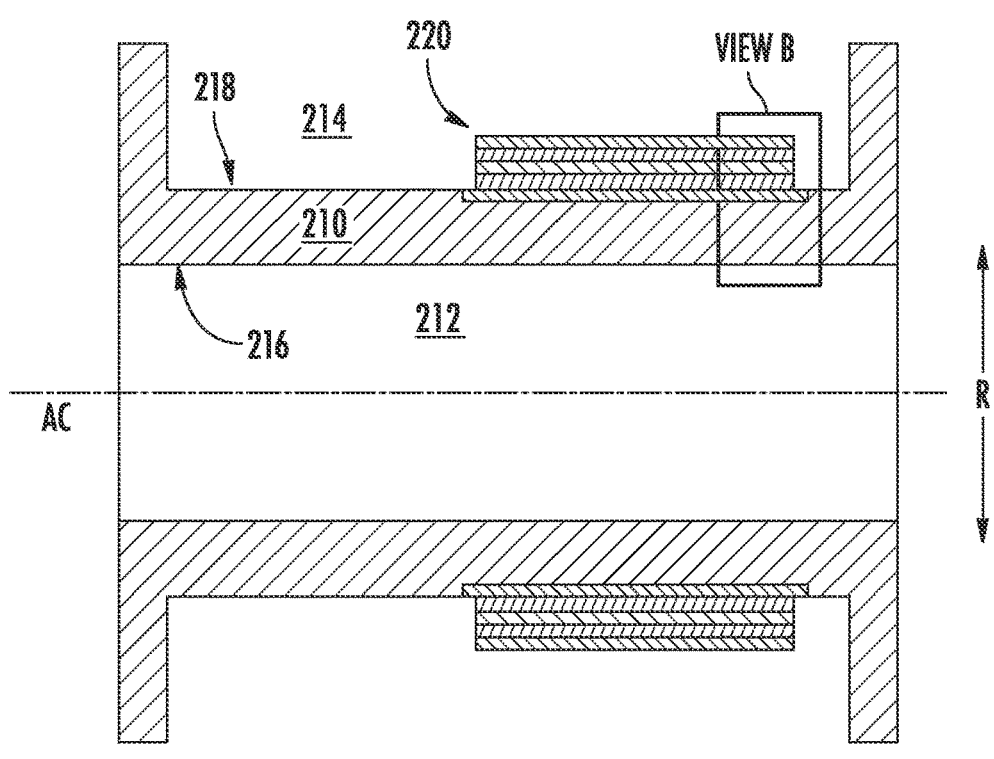
FIG. 5A provides a schematic, cross-sectional view of one example thermoelectric generator that may be implemented in a thermoelectric generator system according to one example embodiment of the present disclosure.
Figure 5B:
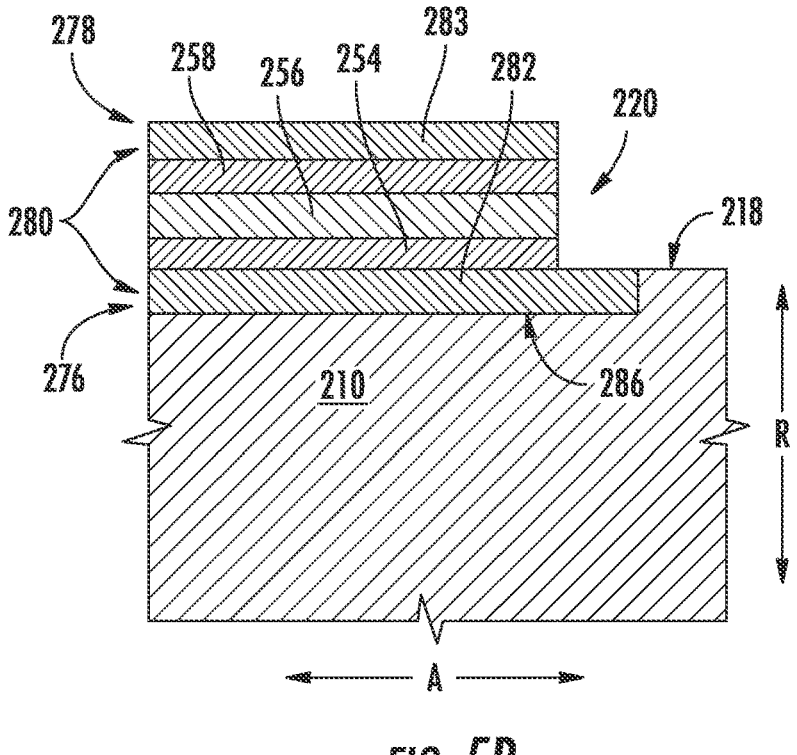
FIG. 5B provides a close-up view of the thermoelectric generator of FIG. 5A taken from View B of FIG. 5A.

With reference now to FIGS. 5A and 5B, FIG. 5A provides a schematic, cross-sectional view of one example thermoelectric generator 220 that may be implemented in a thermoelectric generator system, such as the thermoelectric generator system 200 of FIG. 2. FIG. 5B provides a close-up view of the thermoelectric generator 220 taken from View B of FIG. 5A.

The thermoelectric generator 220 of FIGS. 5A and 5B is generally configured similar to the thermoelectric generator 220 of FIGS. 3A through 3D, except that the thermoelectric generator 220 of FIGS. 5A and 5B is integrated with a phase change material pack (or PCM pack 280). The PCM pack 280 includes a hot side layer 282 (or inner layer in this embodiment) and a cold side layer 284 (or outer layer in this embodiment). The hot side layer 282 is positioned between the casing 210 and the hot side circuit 254 (collectively formed by a network of hot side plates of thermocouples), e.g., along the radial direction R. The cold side layer 284 is positioned outward of the cold side circuit 258 (collectively formed by a network of cold side plates of thermocouples), e.g., along the radial direction R. Stated differently, the hot side circuit 254, the semiconductor layer 256, and the cold side circuit 258 are positioned between the hot side layer 282 and the cold side layer 284 of the PCM pack 280, e.g., along the radial direction R.

For this embodiment, the hot side layer 282 is recessed within the casing 210. That is, the casing 210 defines a recess 286 in which the hot side layer 282 is received. Accordingly, for this embodiment, the outer surface of the hot side layer 282 is aligned with the outer surface 218 of the casing 210 along the radial direction R. By recessing the hot side layer 282 within the casing 210, the hot side layer 282 has additional surface area that contact the casing 210, which may help maintain the hot side layer 282 at a consistent temperature. In other embodiments, the hot side layer 282 can be seated on the outer surface 218 of the casing 210 without being recessed.

The hot side layer 282 and the cold side layer 284 of the PCM pack 280 can be formed of phase change materials, including LiOH(80)-20 L, NaF, and MEPCM-(Al2O3). The placement and positioning of the PCM pack 280 enables the thermoelectric generator 220 to better maintain the temperature differential between the hot side 276 and the cold side 278 of the thermoelectric generator 220, which improves efficiency of the thermoelectric generator 220.

The thermoelectric generator 220 of FIGS. 5A and 5B can be attached to the casing 210, some or all of the elements of the thermoelectric generator 220 can be 3D printed onto the casing 210, or some or all of the elements of the thermoelectric generator 220 can be formed integrally with the casing 210 to form a monolithic component.

As discovered by the inventors, one or more thermoelectric generators of a thermoelectric generator system can be strategically positioned within a turbine engine or configured to enhance their power generation capabilities and efficiency, even during prolonged periods of operation of the turbine engine.

As one example, a turbine engine can include an Active Clearance Control (ACC) system that impinges relatively cool air onto a turbine casing of a turbine so as to control the clearance between rotating blades of the turbine and static components surrounding them. One or more thermoelectric generators can be strategically positioned within an ACC cavity of the ACC system to cool the respective cold sides of the one or more thermoelectric generators, which may increase and/or maintain the temperature differential between the hot and cold sides of the respective thermoelectric generators, which may increase the power generation capability and efficiency of the thermoelectric generators.

Figure 6:
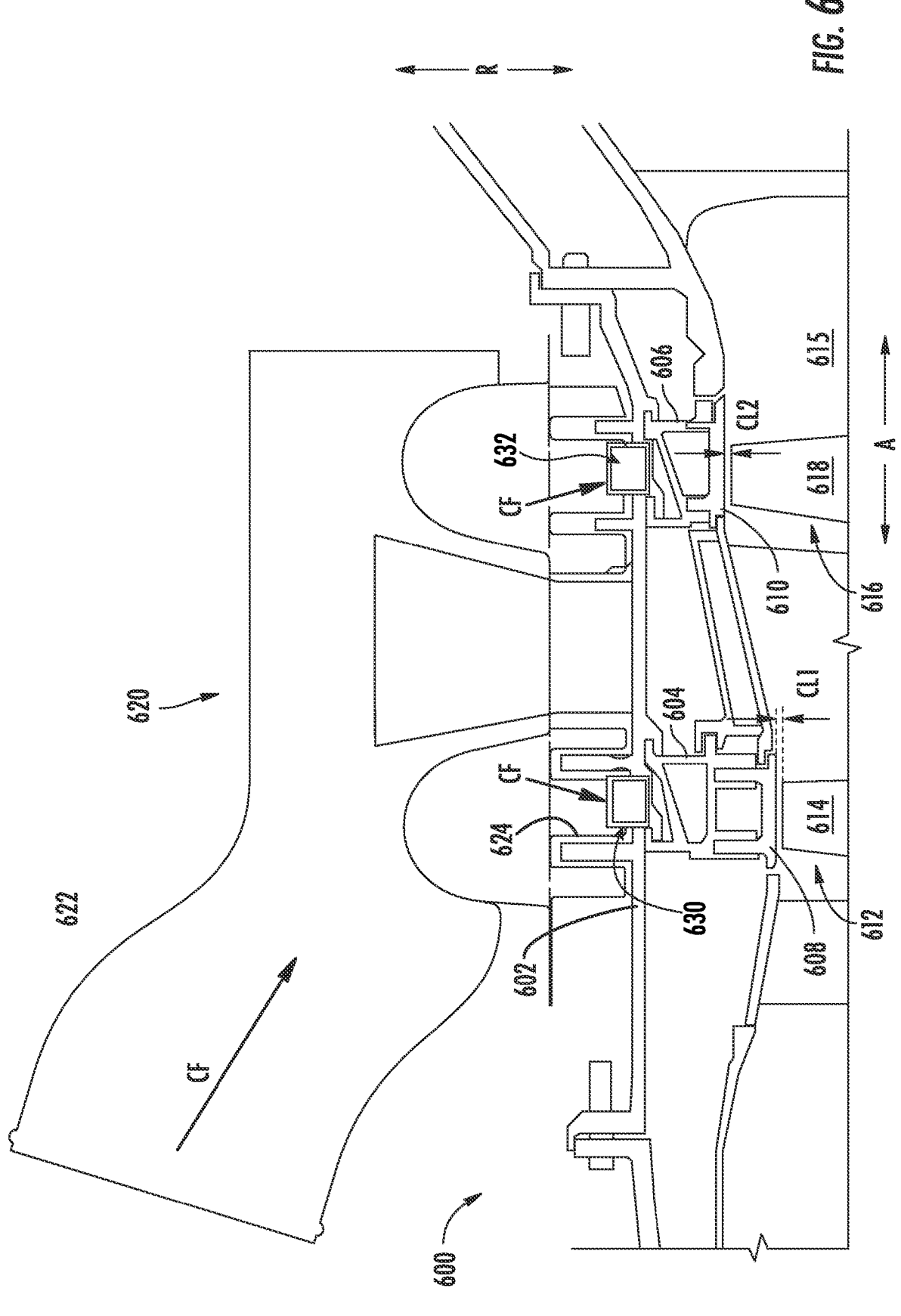
FIG. 6 provides a cross-sectional view of a portion of a high pressure turbine of a turbine engine and depicts thermoelectric generators disposed on a turbine casing within an active clearance control cavity according to one example embodiment of the present disclosure.

For instance, FIG. 6 provides a cross-sectional view of a portion of a high pressure turbine 600 of a turbine engine. The high pressure turbine 600 is a two-stage turbine in this example embodiment. A turbine casing 602 of the high pressure turbine 600 carries hangers 604, 606. The turbine casing 602 can be a section of a core air flowpath, for example. The hangers 604, 606 carry respective shrouds 608, 610. The shrouds 608, 610 respectively surround a first-stage array 612 of rotating blades 614 (only one rotating blade of the first-stage array 612 is shown in FIG. 6) and a second-stage array 616 of rotating blades 618 (only one rotating blade of the second-stage array 616 is shown in FIG. 6). A clearance CL1 is defined between the shroud 608 and the rotating blade 614 and a clearance CL2 is defined between the shroud 610 and the rotating blade 618.

An ACC system 620 is provided to impinge cooling air onto the turbine casing 602 so as to control the clearances CL1, CL2. The ACC system 620 includes a supply line 622 that directs a cooling fluid CF, such as compressor bleed air, to an impingement baffle 624. The impingement baffle 624 includes impingement holes through which cooling fluid CF is channeled to impinge or direct cooling fluid onto the outer surface of the turbine casing 602.

Notably, for this embodiment, one or more thermoelectric generators of a thermoelectric generator system are disposed on the turbine casing 602 (e.g., on the cold side thereof) within the impingement flow path of the cooling fluid CF. Specifically, a first thermoelectric generator 630 is disposed on the turbine casing 602 outward of the first-stage array 612 of rotating blades 614 along the radial direction R, and for this embodiment, the first thermoelectric generator 630 is aligned with the first-stage array 612 of rotating blades 614 along the axial direction A. Likewise, a second thermoelectric generator 632 is disposed on the turbine casing 602 outward of the second-stage array 616 of rotating blades 618 along the radial direction R, and for this example embodiment, the second thermoelectric generator 632 is aligned with the second-stage array 616 of rotating blades 618 along the axial direction A.

Accordingly, the first thermoelectric generator 630 and the second thermoelectric generator 632 are both positioned within an impingement flow path of the cooling fluid CF that is directed onto the turbine casing 602, or stated another way, the first thermoelectric generator 630 and the second thermoelectric generator 632 are both positioned within an ACC cavity or flow path. The relatively cool impingement air directed onto the turbine casing 602 cools the respective cold sides of the first and second thermoelectric generators 630, 632. Heat from the hot gas path of the core air flowpath 615 heats the respective hot sides of the first and second thermoelectric generators 630, 632. Over the course of a mission, conduction heat transfer begins to heat up the outer surface or cold side of the turbine casing 602, which reduces the temperature gradient between the hot side and the cold side of the respective first and second thermoelectric generators 630, 632. Advantageously, the relatively cool impingement air directed onto the turbine casing 602 and respective cold sides of the first and second thermoelectric generators 630, 632 may better maintain the temperature gradient between the hot side and the cold side of the respective first and second thermoelectric generators 630, 632 by keeping the cold sides colder, which may increase their respective power generation capabilities and efficiency. Further, the integrated arrangement of the first and second thermoelectric generators 630, 632 into the ACC system 620 is beneficial in that an existing heat sink or cooling source (i.e., the cooling fluid CF provided by the ACC system 620) may be utilized to increase the power generation capabilities and efficiency of the first and second thermoelectric generators 630, 632. In this regard, the need for an external cooling system may be eliminated or reduced.

As another example, a turbine engine can include a casing having one or more casing walls that separate a relatively cool cavity from a relatively hot cavity. One or more thermoelectric generators of a thermoelectric generator system can be disposed on the casing wall so as to have their respective cold sides directly exposed to the relatively cool cavity and their respective hot sides directly exposed to the relatively hot cavity. Accordingly, the temperature differential between the hot and cold sides of the respective thermoelectric generators can be increased or maintained, which may increase the power generation capability and efficiency of the thermoelectric generators.

For instance, with reference now to FIGS. 7A, 7B, and 7C, FIG. 7A provides a close-up, cross-sectional view of a part of a high pressure compressor 700 of a turbine engine. FIG. 7B provides a view of a first thermoelectric generator 720 taken from View B of FIG. 7A. FIG. 7C provides a close-up, cross-sectional view of the first thermoelectric generator 720 taken from line C-C of FIG. 7B.

As depicted in FIG. 7A, the high pressure compressor 700 includes a compressor casing 702 having a casing arm 704. The compressor casing 702 can be a section of a core casing, for example. The casing arm 704 is connected to a support arm 706 of a core air flowpath casing 708. As shown, the casing arm 704 of the compressor casing 702 and the support arm 706 of the core air flowpath casing 708 collectively form a casing wall 705 that separates a relatively cool cavity 710 from a relatively hot cavity 712. The relatively cool cavity 710 is associated with upstream stages of the high pressure compressor 700 and the relatively hot cavity 712 is associated with downstream stages of the high pressure compressor 700.

For this embodiment, the first thermoelectric generator 720 and a second thermoelectric generator 722 of a thermoelectric generator system are disposed on the casing wall 705. Particularly, the first thermoelectric generator 720 is disposed on the casing arm 704 and the second thermoelectric generator 722 is disposed on the support arm 706. As shown in FIGS. 3B and 3C, the first thermoelectric generator 720 has an electric insulative layer 724 that electrically insulates or electrically decouples the casing wall 705 from a power generation module 726 of the first thermoelectric generator 720. The power generation module 726 is formed of a plurality of thermocouples electrically coupled with one another. The second thermoelectric generator 722 can be configured in a similar manner as the first thermoelectric generator 720.

Notably, as shown in FIGS. 7A and 7C, a first side or cold side 728 of the first thermoelectric generator 720 is directly exposed to the relatively cool cavity 710 and a second side or hot side 730 of the first thermoelectric generator 720 is directly exposed to the relatively hot cavity 712. Likewise, a first side or cold side 732 of the second thermoelectric generator 722 is directly exposed to the relatively cool cavity 710 and a second side or hot side 734 of the second thermoelectric generator 722 is directly exposed to the relatively hot cavity 712. The arrangement of the first and second thermoelectric generators 720, 722 enables the relatively cool cavity 710 to keep the respective cold sides 728, 732 of the first and second thermoelectric generators 720, 722 cool and enables the relatively hot cavity 712 to keep the respective hot sides 730, 734 of the thermoelectric generators 720, 722 hot, even during prolonged periods of operation of the turbine engine, which may increase the power generation capabilities and efficiencies of the first and second thermoelectric generators 720, 722.

As yet another example, a turbine engine can include a casing separating a relatively cool cavity from a relatively hot cavity. The casing can define a port or opening. A thermoelectric generator of a thermoelectric generator system can be received in the port such that the thermoelectric generator is positioned at least in part within the relatively hot cavity. The thermoelectric generator can be clamped to or otherwise connected to the casing, e.g., via one or more bolts. The thermoelectric generator can include an electric insulative layer and a power generation module. The electric insulative layer can define one or more perforations that enable relatively hot fluid to directly contact the power generation module, or more particularly, hot plates of thermocouples of the power generation module. The direct hot gas exposure on the hot side components of the power generation module may increase the temperature differential between the hot side and cold side of thermoelectric generator, which may increase the power generation capability and efficiency of the thermoelectric generator.

Figure 8:
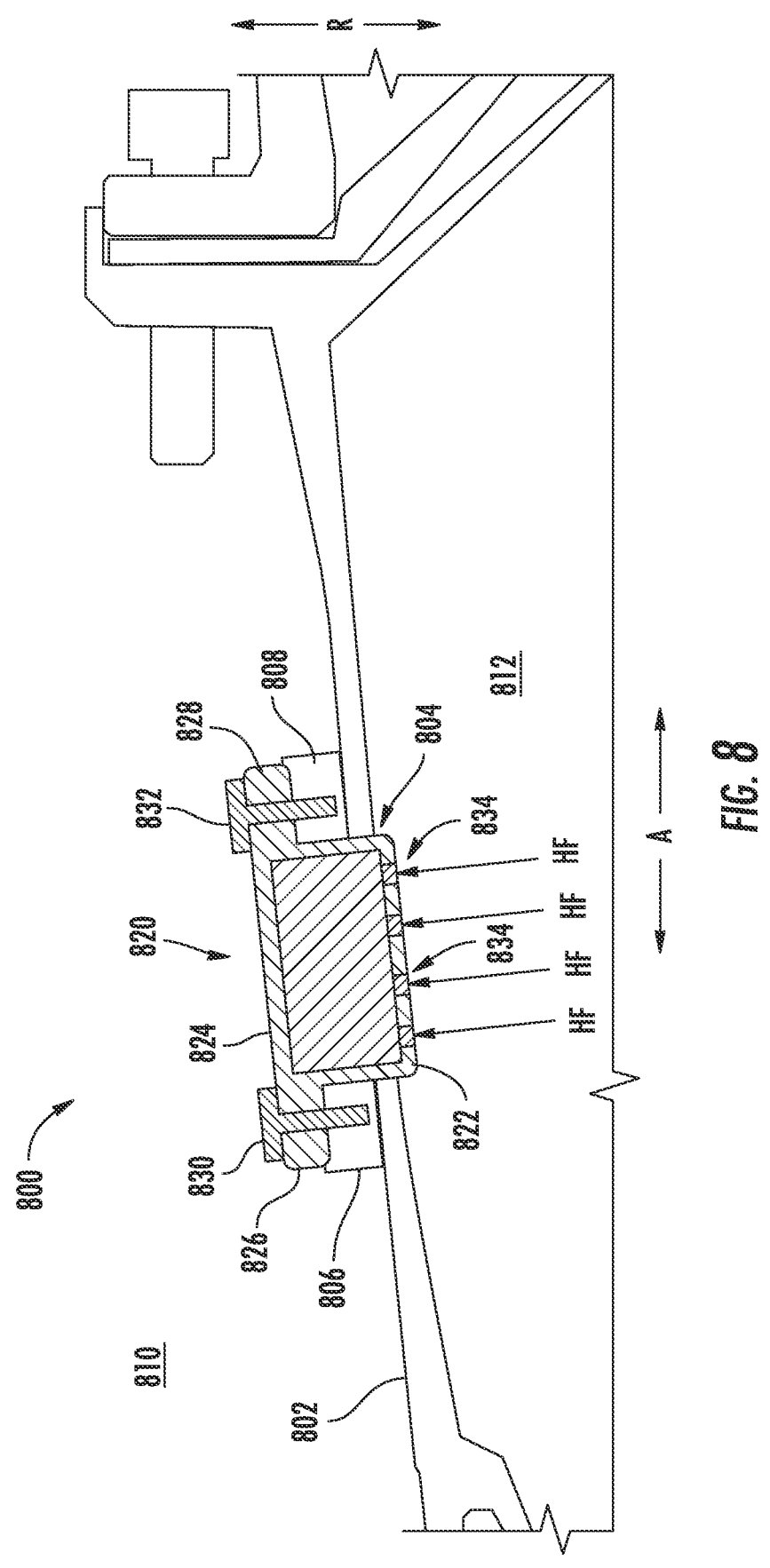
FIG. 8 provides a cross-sectional view of a part of a high pressure compressor of a turbine engine and depicts a thermoelectric generator disposed on a casing according to one example embodiment of the present disclosure.

For instance, FIG. 8 provides a cross-sectional view of a part of a high pressure compressor 800 of a turbine engine. As depicted, the high pressure compressor 800 includes a casing 802 separating a relatively cool cavity 810 from a relatively hot cavity 812. The relatively cool cavity 810 can be an under cowl cavity and the relatively hot cavity 812 can be associated with one or more downstream stages of the high pressure compressor 800. The casing 802 can be a segment of a core casing, for example. The casing 802 defines a port 804 or opening. The casing 802 includes bosses 806, 808 positioned adjacent to the port 804.

A thermoelectric generator 820 of a thermoelectric generator system is received in the port 804. Particularly, the thermoelectric generator 820 is received within the port 804 such that the thermoelectric generator 820 is positioned at least in part within the relatively hot cavity 812. The thermoelectric generator 820 has an electric insulative layer 822 that electrically insulates or electrically decouples the casing 802 from a power generation module 824 of the thermoelectric generator 820. The power generation module 824 is formed of a plurality of thermocouples electrically coupled with one another. The thermoelectric generator 820 also has flanges 826, 828 that align with the bosses 806, 808 of the casing 802. Bolts 830, 832 are inserted through the flanges 826, 828 and into the bosses 806, 808 to connect the thermoelectric generator 820 to the casing 802.

Further, as shown in FIG. 8, the electric insulative layer 822 defines one or more perforations 834 or holes that enable relatively hot fluid HF from the relatively hot cavity 812 to directly contact the power generation module 824, or more particularly, hot plates of thermocouples of the power generation module 824. For the depicted embodiment of FIG. 8, the electric insulative layer 822 defines a plurality of perforations 834. In some embodiments, the perforations 834 are defined so that each one of the perforations 834 aligns with one or more hot plates of the thermocouples forming the power generation module 824 of the thermoelectric generator 820. The direct hot gas exposure on the hot side components of the power generation module 824 may increase the temperature differential between the hot side and cold side of thermoelectric generator 820, which may increase the power generation capability and efficiency of the thermoelectric generator 820.

To summarize, various embodiments of thermoelectric generators for turbine engines have been disclosed herein that may be compact, relatively light in weight, local to the power consuming devices and/or electrical energy storage devices, and efficient at meeting power requirements. The disclosed thermoelectric generators provided herein can be strategically disposed on metallic structural components of turbine engines to harness the heat therefrom to ultimately generate electrical power that can be provided to one or more power consumers and/or electrical energy storage devices. In some embodiments, an electrically insulative layer can be positioned between a casing and a power generation module of a thermoelectric generator to electrically isolate the casing from the power generation module. The electrically insulative layer may have one or more perforations that allow hot fluid from a relatively hot cavity to directly contact the power generation components of the thermoelectric generator, which may facilitate keeping the hot side of the thermoelectric generator hot. Keeping the hot side hot and/or the cold side cold of a thermoelectric generator can increase the temperature differential therebetween, which ultimately can increase the power generation capability and efficiency of the thermoelectric generator. Further, in some embodiments, a thermoelectric generator can include a phase change material pack to help maintain the temperature differential between a hot side and a cold side of the thermoelectric generator, which may enhance its power generation capabilities and efficiency. In yet other embodiments, a thermoelectric generator can be integrally constructed with the metallic structural component through hybrid/additive/cold spray/thermal spray manufacturing techniques. 3D printing the thermoelectric generator integral with the metallic structural component can enable optimal usage of available space and may create a compact and light electrical power source that can be positioned local to one or more power consumers.

Further aspects are provided by the subject matter of the following clauses:

A turbine engine, comprising: a core having a compressor, a combustor, and a turbine section in serial flow arrangement, the core having a casing surrounded by an engine cowl; and a thermoelectric generator attached to or formed integrally with the casing.

The turbine engine of any preceding clause, wherein the thermoelectric generator is attached to the casing.

The turbine engine of any preceding clause, wherein the thermoelectric generator is formed integrally with the casing.

The turbine engine of any preceding clause, wherein the thermoelectric generator is formed of one or more thermocouples, each one of the one or more thermocouples includes a hot side plate formed of an electrically conducting material, a cold side plate formed of electrically conducting material, and a semiconductor array positioned between the hot side plate and the cold side plate.

The turbine engine of any preceding clause, wherein the casing is formed of a metallic material and the thermoelectric generator includes an electrically insulative layer positioned between the casing and the cold side plate.

The turbine engine of any preceding clause, wherein the electrically insulative layer is a thin film ceramic coating.

The turbine engine of any preceding clause, wherein the thermoelectric generator includes a phase change material pack that includes an inner layer and an outer layer.

The turbine engine of any preceding clause, wherein the hot side plate, the semiconductor array, and the cold side plate are positioned between the inner layer and the outer layer of the phase change material pack.

The turbine engine of any preceding clause, wherein the inner layer is received within a recess of the casing.

The turbine engine of any preceding clause, wherein the engine cowl defines an under cowl cavity and the thermoelectric generator is disposed within the under cowl cavity.

The turbine engine of any preceding clause, further comprising: an active clearance control system that directs a cooling fluid onto a cold side of the thermoelectric generator.

The turbine engine of any preceding clause, wherein the casing separates a relatively cool cavity from a relatively hot cavity, and wherein the thermoelectric generator is positioned along the casing such that a hot side of the thermoelectric generator is directly exposed to the relatively hot cavity and a cold side of the thermoelectric generator is directly exposed to the relatively cool cavity.

The turbine engine of any preceding clause, wherein the casing separates a relatively cool cavity from a relatively hot cavity, and wherein the casing defines a port in which the thermoelectric generator is received, the thermoelectric generator being positioned such that at least a part of the thermoelectric generator is positioned within the relatively hot cavity, the thermoelectric generator has an electric insulative layer and a power generation module, the electric insulative layer defines one or more perforations that enable relatively hot fluid from the relatively hot cavity to directly contact the power generation module.

The turbine engine of any preceding clause, wherein the casing is a bleed duct casing.

The turbine engine of any preceding clause, wherein the casing is one of a compressor casing, a combustor casing, and a turbine casing.

A thermoelectric generator for a turbine engine, comprising: a power generation module formed of a plurality of thermocouples; and an electrically insulative layer or a first layer of a phase change material, the electrically insulative layer or the first layer of the phase change material being positioned between a metallic structural component of the turbine engine and the power generation module.

The thermoelectric generator of any preceding clause, wherein the thermoelectric generator extends annularly around the metallic structural component or is one of a plurality of thermoelectric generators electrically coupled with one another.

A method of integrally forming a thermoelectric generator with a structural component of a turbine engine via a 3D printing process, the method comprising: printing one or more layers to form an electric insulative layer or a first layer of a phase change material pack adjacent to the structural component; printing one or more layers to form a hot side circuit adjacent to the electric insulative layer or the first layer of the phase change material pack; printing one or more layers to form a semiconductor layer adjacent to the hot side circuit with semiconductor materials for N-type and P-type semiconductors; and printing one or more layers to form a cold side circuit adjacent to the semiconductor layer.

The method of any preceding clause, further comprising: printing one or more layers to form a second layer of the phase change material pack adjacent to the cold side circuit.

The method of any preceding clause, further comprising: printing one or more layers to form the structural component, the structural component, the electric insulative layer or the first layer, the hot side circuit, the semiconductor layer, and the cold side circuit being formed as a monolithic component.

A turbine engine, comprising: a core having a metallic structure; and a thermoelectric generator attached to or formed integrally with the metallic structure, the thermoelectric generator being formed of one or more thermocouples, each one of the one or more thermocouples including a hot side plate formed of an electrically conducting material, a cold side plate formed of electrically conducting material, and a semiconductor array positioned between the hot side plate and the cold side plate.

The turbine engine of any preceding clause, further comprising: a means for electrically insulating the metallic structure and the semiconductor array.

The turbine engine of any preceding clause, wherein the means is a ceramic coating.

The turbine engine of any preceding clause, wherein the ceramic coating has one or more perforations.

The turbine engine of any preceding clause, wherein the means is an inner layer of a phase change material pack.

This written description uses examples to disclose the present disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

We claim:

1. A thermoelectric generator for a turbine engine, comprising:
   a casing including an outer surface and an inner surface, the inner surface facing a core air flowpath of the turbine engine and the outer surface facing an under cowl cavity;
   a power generation module formed of a plurality of thermocouples arranged on the outer surface of the casing in a serpentine configuration, the power generation module being directly exposed within the under cowl cavity; and
   an electrically insulative layer or a first layer of a phase change material, the electrically insulative layer or the first layer of the phase change material being positioned between the outer surface of the casing and the power generation module.

2. The thermoelectric generator for a turbine engine of claim 1, wherein the thermoelectric generator extends annularly around the metallic structural component or is one of a plurality of thermoelectric generators electrically coupled with one another.

3. The thermoelectric generator for a turbine engine of claim 1, wherein the power generation module and the electrically insulative layer are formed integrally with the casing.

4. The thermoelectric generator for a turbine engine of claim 1, wherein each one of the plurality of thermocouples includes a hot side plate formed of an electrically conducting material, a cold side plate formed of electrically conducting material, and a semiconductor array positioned between the hot side plate and the cold side plate.

5. The thermoelectric generator for a turbine engine of claim 4, wherein the casing is formed of a metallic material, and further comprising an electrically insulative layer positioned between the casing and the cold side plate.

6. The thermoelectric generator for a turbine engine of claim 5, wherein the electrically insulative layer is a thin film ceramic coating.

7. The thermoelectric generator for a turbine engine of claim 4, further comprising a phase change material pack that includes an inner layer and an outer layer.

8. The thermoelectric generator for a turbine engine of claim 7, wherein the hot side plate, the semiconductor array, and the cold side plate are positioned between the inner layer and the outer layer of the phase change material pack.

9. The thermoelectric generator for a turbine engine of claim 8, and wherein the inner layer is received within a recess of the casing.

10. The thermoelectric generator for a turbine engine of claim 1, wherein an engine cowl defines an under cowl cavity and the power generation module and the electrically insulative layer are disposed within the under cowl cavity.

11. The thermoelectric generator for a turbine engine of claim 1, further comprising:
   an active clearance control system that directs a cooling fluid onto a cold side of the thermoelectric generator.

12. The thermoelectric generator for a turbine engine of claim 1, wherein the casing separates a relatively cool cavity from a relatively hot cavity, and wherein the casing is positioned such that a hot side of the thermoelectric generator is directly exposed to the relatively hot cavity and a cold side of the thermoelectric generator is directly exposed to the relatively cool cavity.

13. The thermoelectric generator for a turbine engine of claim 1, wherein the casing is one of a compressor casing, a combustor casing, or a turbine casing.

14. The thermoelectric generator for a turbine engine of claim 1, wherein the serpentine configuration comprises a first portion extending along the axial direction, and a second portion connected with the first portion and extending along the circumferential direction.

15. The thermoelectric generator for a turbine engine of claim 1, wherein the casing separates a relatively cool cavity from a relatively hot cavity, and wherein the casing defines a port in which the thermoelectric generator is received, the thermoelectric generator being positioned such that at least a part of the thermoelectric generator is positioned within the relatively hot cavity, the thermoelectric generator has an electric insulative layer and a power generation module, the electric insulative layer defines one or more perforations that enable relatively hot fluid from the relatively hot cavity to directly contact the power generation module.

16. The thermoelectric generator for a turbine engine of claim 1, wherein the casing is a bleed duct casing.

* * * * *